US008045409B2

(12) United States Patent
Hirota et al.

(10) Patent No.: US 8,045,409 B2
(45) Date of Patent: Oct. 25, 2011

(54) SEMICONDUCTOR MEMORY DEVICE

(75) Inventors: Takuya Hirota, Kawasaki (JP); Takao Yanagida, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 195 days.

(21) Appl. No.: 12/603,879

(22) Filed: Oct. 22, 2009

(65) Prior Publication Data
US 2010/0103756 A1 Apr. 29, 2010

(30) Foreign Application Priority Data

Oct. 27, 2008 (JP) ................................ 2008-275424

(51) Int. Cl.
*G11C 7/00* (2006.01)
(52) U.S. Cl. ...................................... 365/201; 365/203
(58) Field of Classification Search .................. 365/201, 365/203, 154
See application file for complete search history.

(56) References Cited

U.S. PATENT DOCUMENTS

| 5,255,230 A * | 10/1993 | Chan et al. ..................... 365/201 |
| 5,956,279 A * | 9/1999 | Mo et al. ........................ 365/201 |
| 6,501,692 B1 * | 12/2002 | Melanson et al. ............. 365/201 |
| 2010/0054062 A1 * | 3/2010 | Kobatake ....................... 365/201 |

FOREIGN PATENT DOCUMENTS

| JP | 2000-067598 A | 3/2000 |
| JP | 2002-184198 A | 6/2002 |
| JP | 2002-313083 A | 10/2002 |

* cited by examiner

*Primary Examiner* — Anh Phung
(74) *Attorney, Agent, or Firm* — Sughrue Mion, PLLC

(57) ABSTRACT

A semiconductor memory device includes a plurality of memory cells that are arranged at intersections of a word line with bit line pairs, a precharge circuit that is arranged for each of the bit line pairs and is configured to precharge each of the bit line pairs, and a Y-switch circuit that is arranged for each of the bit line pairs and is configured to select each of the bit line pairs. The semiconductor memory device further includes a mode switching unit that switches the normal mode and the test mode in accordance with a mode selection signal that is externally supplied, a plurality of individual control units that control operation of each of the precharge circuits in accordance with operation of each of the Y-switch circuits in the normal mode, and a block control unit that collectively turns off all of the precharge circuits in the test mode.

5 Claims, 11 Drawing Sheets

SEMICONDUCTOR MEMORY DEVICE

BACKGROUND

1. Field of the Invention

The present invention relates to a semiconductor memory device, and more specifically, to a semiconductor memory device that is suitable for high-speed operation and capable of analyzing detailed failure.

2. Description of Related Art

A semiconductor memory device that includes SRAM cells is known. For example, FIG. 7 shows a semiconductor memory device where a precharge system used in a low power SRAM is mounted.

Such a low power system SRAM is also disclosed, for example, in FIG. 1 of Japanese Unexamined Patent Application Publication No. 2002-184198.

As shown in FIG. 7, a low power system SRAM 10 includes a memory array 11 formed of memory cells C00 and C01 arranged at intersections of bit line pairs (BP00, BP01) with a word line WORD, a precharge unit 12 that includes a plurality of precharge circuits PC00 and PC01 that precharge each bit line pair BP00 and BP01, and a Y-switch unit 13 that includes a plurality of Y-switch circuits YS00 and YS01 that select each bit line pair BP00 and BP01.

Each of the memory cells C00 and C01 is arranged at intersections of the bit line pairs BP00 and BP01 with the word line WORD, and is arranged in matrix as a whole.

In FIG. 7, two memory cells are shown as a representative example.

The memory cells C00 and C01 are well-known static memory cells (SRAMs). The precharge circuits PC00 and PC01 are arranged for each bit line pair BP00, BP01. Then, all the precharge circuits PC00 and PC01 are connected to a precharge control line LPC that is horizontally arranged, and collectively controlled by a block selection signal BLKsel that is supplied to the precharge control line LPC.

Further, FIG. 8 is a timing chart describing the operation of the low power system SRAM.

As the block selection signal BLKsel is changed from an L level to an H level in this low power system SRAM, the precharge operation of the precharge circuits PC00 and PC01 is turned off. Further, as the word line WORD becomes the H level and a Y switch selection signal Ysel00 becomes the H level to turn on the Y-switch circuit YS00 that selects the bit line pair BP00 to which the memory cell C00 which is the reading target is connected, data reading/writing is made possible from/to the memory cell C00.

In recent years, lines in a semiconductor memory device have been miniaturized in order to realize reduction in size, which may cause defects such as a short-circuit of the lines during a manufacturing process.

FIG. 9 shows an enlarged view of one of static memory cells (SRAMs).

For example, as shown in dashed lines in FIG. 9, such a defect may be caused that a node system of the SRAM shorts out with the GND. In order to overcome such a problem, it is required to analyze detailed failure of each memory cell regarding such a defect before mass production and to improve the product yield.

As one of the failure analyses of memory cells, one method is known that performs long write which is longer than normal writing on each memory cell C00 and C01.

In performing such a failure analysis, for the memory cell C00 which is the test target, the word line WORD is made to the H level, the Y-switch circuit YS00 is made to the ON state (Ysel is in the H level), and the potential difference corresponding to the write data is applied to the bit line pair BP00 for performing long write.

At this time, if current flows in the memory cell C00, there is a high possibility that any defect occurs that is connected to the GND side in a memory cell part node where High is written or any defect occurs that is connected to the VDD side in a memory cell part node where Low is written.

As such, by detecting the current that flows in the memory cell while executing the long write, the memory cell can be analyzed in detail.

In the related art, the above-described detailed test has been performed on the circuit of the SRAM memory as shown in FIG. 7 to improve the product yield.

Note that the failure test of the memory by the long write is also employed in a technique disclosed in Japanese Unexamined Patent Application Publication No. 2000-067598, for example, although its purpose is different from the one described above.

By the way, in recent years, high-speed operation has also been strongly desired along with the miniaturization of semiconductor memory devices.

However, the low power system SRAM as shown in FIG. 7 cannot cope with the high-speed operation.

According to the low power system SRAM shown in FIG. 7, in performing data reading/writing from/to the memory cell, the precharge circuits PC00 and PC01 are collectively turned off by the block selection signal BLKsel supplied to the precharge control line LPC.

Although only the memory cell C00 that is connected to the Y-switch circuit YS00 that is selected is read/written through a common bit line pair LIOT/LION, the potential at full amplitude is applied to the bit lines BT01 and BN01 even in the bit line pair BP01 which is not selected, as shown in FIG. 8.

Accordingly, all the bit line pairs BP00 and BP01 need to be charged to full capacity in order to execute the next precharge, which causes extremely large current consumption peak.

If there is a large current consumption peak, the power supply drop may easily be produced, which cannot assure the following high-speed operation or stable operation.

Accordingly, the low power system SRAM as shown in FIG. 7 is not suitable for the high-speed operation.

For example, a high-speed operation system SRAM as shown in FIG. 10 is known.

FIG. 10 is a circuit example in which a precharge system employed in a normal high-speed system SRAM or the like is mounted.

Such a high-speed system SRAM is disclosed also in FIG. 2, for example, of Japanese Unexamined Patent Application Publication No. 2002-313083.

In such a high-speed system SRAM, gates of the precharge circuits PC00 and PC01 are controlled in accordance with each of the Y-switch circuits YS00 and YS01.

FIG. 11 is a timing chart describing the operation of the high-speed system SRAM.

In such a high-speed system SRAM, the selection signal Ysel00 of the Y-switch circuit YS00 that selects the memory cell which is the reading/writing target and the word line WORD are controlled substantially in the same way.

When the selection signal YSW00 of the Y-switch circuit YS00 that selects the memory cell C00 which is the target of reading/writing is changed from the L level to the H level, the precharge circuit PC00 in accordance with the Y-switch circuit YS00 becomes the OFF state.

The data reading/writing from/to the memory cell C00 is made possible with this state.

When the precharge circuit is made OFF state and the data reading from the memory cell C00 is executed, for example, potentials of VDD, and GND are shown in the bit line pair BP00 (BT/BN00), respectively, which is connected to the memory cell C00 which is the writing/reading target.

On the other hand, the precharge circuit PC01 remains in the ON state in the bit line pair BP01 of the memory cell C01 which is not the target of reading/writing. Thus, the potential remains in the VDD with little change, or keeps VDD-a within a range of minor (a) fluctuation, if any.

Accordingly, for performing the precharge after the reading/writing operation, only the limited amount needs to be charged again, which causes only a small peak current due to the precharge.

Compared with FIG. 7 where the low power system SRAM collectively supplies charge to all the precharge circuits (PC00, PC01) for the precharge operation after the reading/writing operation, the high-speed system SRAM shown in FIG. 10 requires little current for the precharge and produces no abrupt current consumption peak, whereby the high-speed operation may be stably performed.

SUMMARY

The present inventors have found a problem that, in the high-speed system SRAM shown in FIG. 10, detailed failure analysis of the memory cell cannot be performed.

In analyzing the failure of the memory cell, long write which is longer than the normal writing is performed on each memory cell, and detection is made regarding whether there is a current that flows in the memory cell during the execution of the long write, so as to judge presence or absence of the defect in the memory cell.

Even when there is a current that leaks from the defective memory cell, a value of the current that flows at this time is extremely small.

Accordingly, in order to analyze the failure of the memory cell in detail, it is assumed that no extra current flows during the execution of the long write.

In view of this, in the low power system SRAM shown in FIG. 7, all the precharge circuits are simultaneously turned off. Thus, only the failed current of the memory cell part which is the target may be measured with eliminating the influence of the operation current of the circuit other than the memory cell which is the test target.

However, in the high-speed system SRAM shown in FIG. 10, as described above, the precharge circuit in accordance with the Y-switch circuit which is not selected is always in the ON state, and a through current flows in the SRAM memory cell part which is collectively selected by the word line.

As the number of memory cells that are not selected is extremely large and the value of the through current also becomes extremely large, it is difficult to analyze the failure in detail which can be applied to the low power system SRAM as shown in FIG. 7.

In view of such a situation, the detailed failure analysis and the high-speed operation of the semiconductor memory device cannot be realized at the same time.

A first exemplary aspect of an embodiment of the present invention is a semiconductor memory device including a plurality of memory cells that are arranged at intersections of a word line with bit line pairs, a precharge circuit that is arranged for each of the bit line pairs, the precharge circuit being configured to precharge each of the bit line pairs, and a Y-switch circuit that is arranged for each of the bit line pairs, the Y-switch circuit being configured to select each of the bit line pairs, in which the semiconductor memory device is configured to execute two modes of a normal mode and a test mode by switching the two modes, the normal mode being a mode that executes reading or writing of normal memory data, the test mode being a mode that is capable of executing long write on a memory cell which is a test target, the semiconductor memory device further including a mode switching unit that switches the normal mode and the test mode in accordance with a mode selection signal that is externally supplied, a plurality of individual control units that control operation of each of the precharge circuits in accordance with operation of each of the Y-switch circuits in the normal mode, and a block control unit that turns off all of the precharge circuits by a command by a block selection signal in the test mode.

According to such a configuration, the precharge operation of the precharge circuit is individually controlled by the individual control unit in accordance with the operation of the individual Y-switch circuit in the normal mode.

For example, in the normal operation, the precharge timing of each bit line pair is individually controlled so as not to cause the power supply drop by the current consumption peak. Accordingly, the semiconductor memory device that is able to secure the stable operation even in high speed can be realized.

On the other hand, in the test mode, all the precharge circuits are collectively turned off by the block control unit.

In the test mode, the accurate failure analysis cannot be performed if there flows a current other than the current of the long write that is applied to the memory cell which is the test target. However, according to the present invention, the test mode is selected, and then the precharge is collectively turned off by the block control unit, whereby presence or absence of the leak current can be analyzed in detail for each memory cell.

As stated above, by selectively separating the normal mode and the test mode and dividing the function unit that performs control of the precharge circuit into the individual control unit and the block control unit in accordance with the test mode and the normal mode, the stable high-speed operation is made possible in the normal mode and the failure analysis can be executed for each memory cell in the test mode.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

The first and second exemplary embodiments can be combined as desirable by one of ordinary skill in the art.

The exemplary embodiments according to the present invention will be described with reference to the drawings in which the same elements are denoted by the same reference symbols.

First Exemplary Embodiment

Now, the first exemplary embodiment according to a semiconductor memory device of the present invention will be described.

Figure 1:
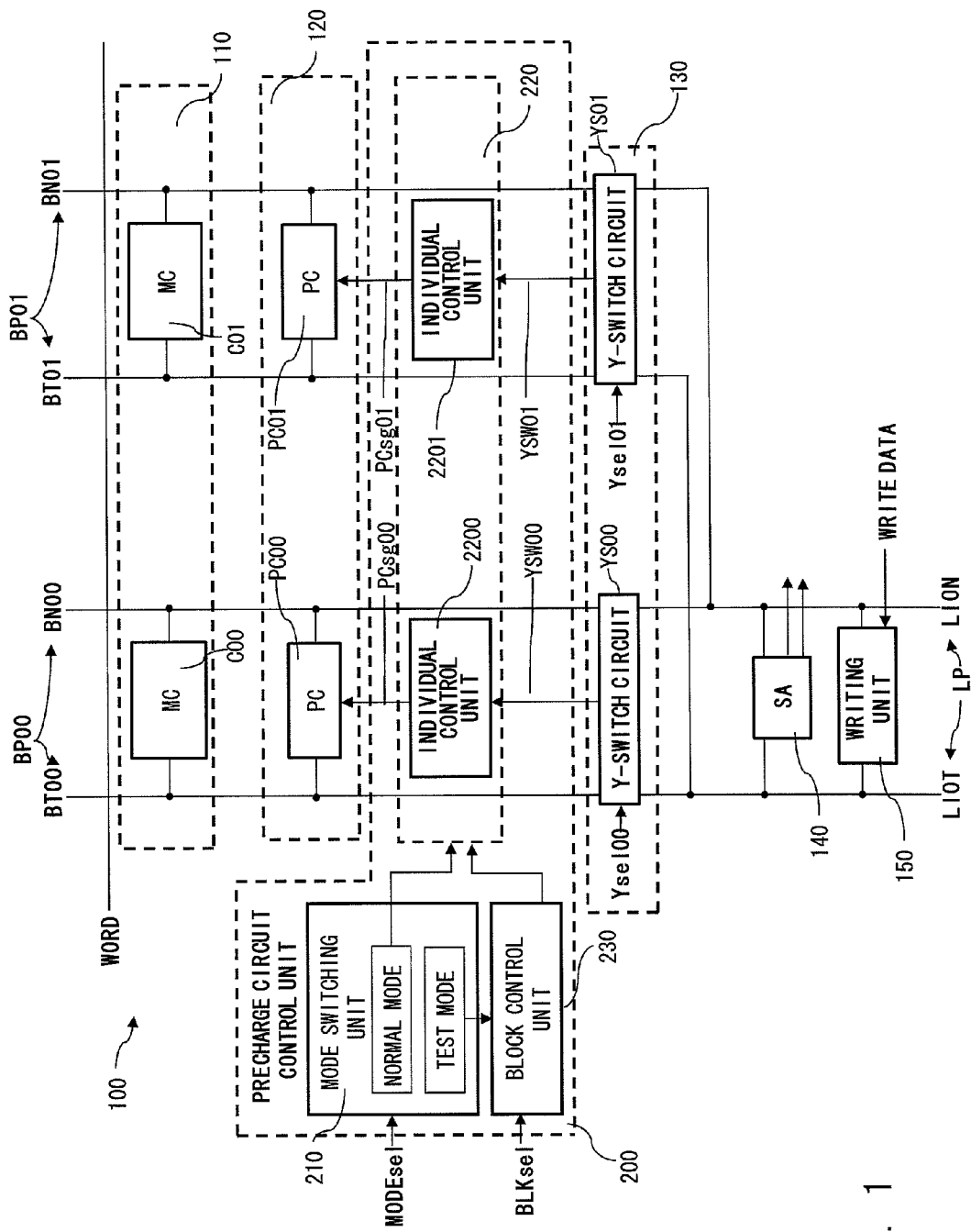
FIG. 1 shows the whole configuration according to a first exemplary embodiment.

FIG. 1 is a diagram showing the whole configuration of the first exemplary embodiment.

A semiconductor memory device 100 includes a memory array 110, a precharge circuit group 120, a Y-switch circuit group 130, a sense amplifier 140, a writing unit 150, and a precharge circuit control unit 200.

The memory array 110 includes a plurality of memory cells C00 and C01 that are arranged at intersections of bit line pairs BP00 and BP01 with a word line WORD.

Each of the memory cells C00 and C01 is arranged at intersections of the bit line pairs BP00 and BP01 with the word line WORD, and is arranged in matrix as a whole.

Note that, in FIG. 1, two memory cells C00 and C01 are shown as a representative example. Bit lines of the bit line pair BP00 where the memory cell C00 is arranged are BT00 and BN00. Bit lines of the bit line pair BP01 where the memory cell C01 is arranged are BT01 and BN01. The memory cells C00 and C01 are well-known static memory cells.

The precharge circuit group 120 includes a plurality of precharge circuits (PC00, PC01) that precharge each bit line pair BP00 and BP01. The precharge circuits (PC00, PC01) are arranged for each bit line pair BP00 and BP01. Note that, in FIG. 1, two precharge circuits (PC00, PC01) are shown as a representative example.

The precharge circuit arranged in the bit line pair BP00 is the precharge circuit PC00, and the precharge circuit arranged in the bit line pair BP01 is the precharge circuit PC01.

The Y-switch circuit group 130 includes a plurality of Y-switch circuits (YS00, YS01) arranged for each bit line pair BP00, BP01.

In FIG. 1, two Y-switch circuits YS00 and YS01 are shown as a representative example.

The Y-switch circuits (YS00, YS01) are turned on or off by Y selection signals Ysel00 and Ysel01 that are separately input. The Y-switch circuits (YS00, YS01) open the bit line pairs BP00 and BP01, and enable data reading/writing from/to the memory cells C00 and C01 when the circuits are controlled to be ON state by the Y selection signals Ysel00 and Ysel01.

On the other hand, the Y-switch circuits (YS00, YS01) interrupt the bit line pairs BP00 and BP01, and disable data reading/writing from/to the memory cells C00 and C01 when the Y-switch circuits are controlled to be OFF state by the Y selection signals Ysel00 and Ysel01.

The Y selection signals Ysel00 and Ysel01 that are control signals of the Y-switch circuits YS00 and YS01 are also supplied to the precharge circuits PC00 and PC01 through the precharge circuit control unit 200. This point will be described later.

After passing through the Y-switch circuits YS00 and YS01, corresponding bit lines of the bit line pairs BP00 and BP01 are connected to be combined as a common bit line pair LP. In other words, BT00 and BT01 are connected together and this is connected to a common bit line LIOT, and BN00 and BN01 are connected together and this is connected to a common bit line LION.

The sense amplifier 140 is provided in the common bit line pair LP to detect and amplify the potential difference between the bit lines in reading data and output data which is read out.

The writing unit 150 is provided in the common bit line pair LP, and supplies the write data externally supplied to the bit lines with a predetermined voltage difference.

The precharge circuit control unit 200 includes a mode switching unit 210 that switches a normal mode and a test mode, an individual control unit group 220 that includes individual control units 2200 and 2201 that control the operation of the individual precharge circuits PC00 and PC01 in accordance with the operation of the Y-switch circuits YS00 and YS01 in the normal mode, and a block control unit 230 that turns off all the precharge circuits PC00 and PC01 in the test mode.

The mode switching unit 210 receives a mode selection signal MODEsel that switches and selects the normal mode and the test mode.

The mode switching unit 210 selects the normal mode when the mode selection signal MODEsel is in an L level.

Upon selection of the normal mode, the operation of the block control unit 230 is stopped.

Further, the mode switching unit 210 selects the test mode when the mode selection signal MODEsel is in an H level.

Upon selection of the test mode, the operation of the block control unit 230 is in the ON state.

The operation of the individual control unit group 220 and the block control unit 230 will be described later in detail.

The individual control unit group 220 includes a plurality of individual control units (2200, 2201) arranged for each of the bit line pairs BP00 and BP01.

The individual control units 2200 and 2201 receive Y operation signals YSW00 and YSW01 of the Y-switch circuits YS00 and YS01, respectively, arranged in the same bit line pair. The individual control units 2200 and 2201 supply precharge control signals PCsg00 and PCsg01 in accordance with the Y operation signals YSW00 and YSW01 to the precharge circuits PC00 and PC01, respectively.

More specifically, the individual control units 2200 and 2201 output precharge control signals PCsg00 and PCsg01 that turn on the corresponding precharge circuits PC00 and PC01, respectively, when the Y-switch circuits YS00 and YS01 are in the OFF state (when the bit line pair is not selected).

On the other hand, the individual control units 2200 and 2201 output precharge control signals PCsg00 and PCsg01 that turn off the corresponding precharge circuits PC00 and PC01, respectively, when the Y-switch circuits YS00 and YS01 are in the ON state (when the bit line pair is selected).

However, when the test mode is selected in the mode switching unit 210 and the OFF command of the precharge circuits PC00 and PC01 is output from the block control unit 230, the individual control units 2200 and 2201 output the precharge control signals PCsg00 and PCsg01 that turn off the precharge circuits PC00 and PC01, respectively, regardless of the Y operation signals YSW00 and YSW01 of the Y-switch circuits YS00 and YS01.

The block control unit 230 is in the operation state when the test mode is selected in the mode switching unit 210.

A block selection signal BLKsel is input to the block control unit 230. When the block selection signal BLKsel is in the H level in the test mode, the block control unit 230 supplies a command to turn off all the precharge circuits PC00 and PC01 to the individual control unit group 220.

The operation of the first exemplary embodiment having such a configuration will be described.

First, the operation of the normal mode will be described.

Figure 2:
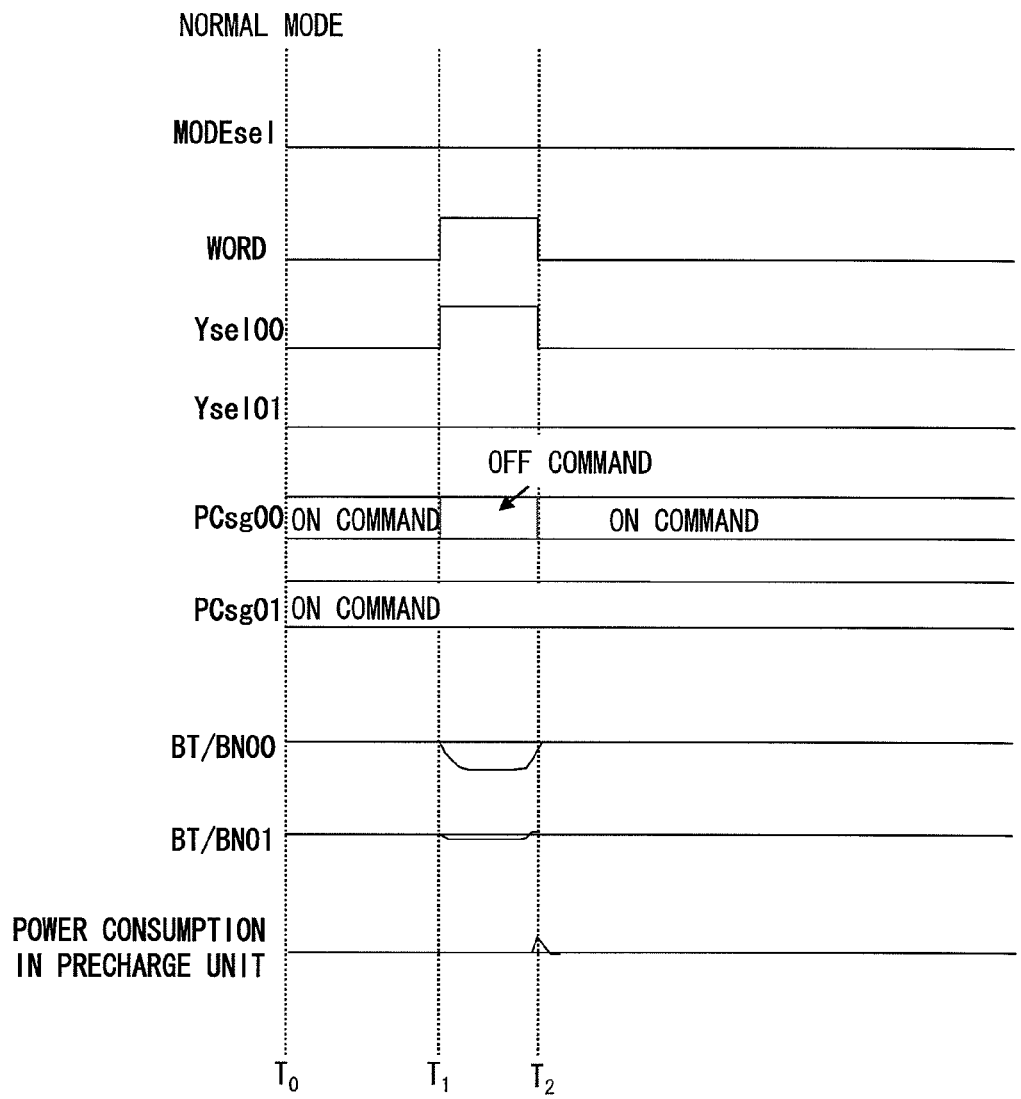
FIG. 2 is a timing chart in a normal mode according to the first exemplary embodiment.

FIG. 2 is a timing chart in the normal mode.

Referring to FIG. 2, description will be made of operation of the precharge circuits and the Y-switch circuits when data is written into the memory cell or data is read out from the memory cell, the current that flows in each of the bit line pairs, and power consumption in the precharge circuits in the normal mode.

In the normal mode, the mode selection signal MODEsel is fixed to the L level. A period from time T0 to time T1 shows a standby state, where neither the data writing nor the data reading is performed. In this state, both of the word line WORD and the Y selection signals Ysel00 and Ysel01 are in the L level.

In this state, the Y-switch circuit YS00 is in the OFF state, and thus, the individual control unit 2200 outputs the precharge control signal PCsg00 that turns on the precharge circuit PC00 in accordance with the Y operation signal YSW00 from the Y-switch circuit YS00.

Accordingly, the precharge circuit PC00 is in the ON state, and the bit line pair BP00 (BT/BN00) is precharged.

Similarly, as the Y-switch circuit YS01 is in the OFF state, the individual control unit 2201 outputs the precharge control signal PCsg01 that turns on the precharge circuit PC01 in accordance with the Y operation signal YSW01 from the Y-switch circuit YS01.

Accordingly, the precharge circuit PC01 is in the ON state and the bit line pair BP01 (BT/BN01) is precharged.

At time T1, the data in the memory cell C00 is started to be read out.

In this case, the Y-switch circuit YS00 and the word line WORD that correspond to the memory cell C00 that is read out are selected and are in the ON state. In other words, the word line WORD is in the H level and the Y selection signal Ysel00 that selects the Y-switch circuit YS00 is in the H level at time T1.

The Y-switch circuit YS01 that corresponds to the memory cell that is not selected (C01) remains in the OFF state, and the Ysel01 keeps the L level.

As the Y-switch circuit YS00 is in the ON state, the individual control unit 2200 outputs the precharge control signal PCsg00 that turns off the precharge circuit PC00 in accordance with the Y operation signal YSW00 from the Y-switch circuit YS00 and the precharge circuit PC00 is in the OFF state.

Further, as the Y-switch circuit YS01 keeps the OFF state, the precharge circuit PC01 keeps the ON state.

Then, in the bit line pair BP00 (BT/BN00), the bit lines BT00 and BN00 are gradually displaced to the VDD and GND, respectively, in accordance with the potential of each storage node of the memory cell C00.

The potentials of the bit lines BT00 and BN00 are directly transmitted to the common bit lines LIOT and LION, and read out through the sense amplifier 140.

When the data is written into the memory cell C00, the write data is applied from the writing unit 150 to the bit line pair BP00 (BT00/BN00) through the common bit lines LIOT/LION, and the data is written in the memory cell C00.

On the other hand, in the bit line pair BP01 (BT/BN01) which is not selected, the Y-switch circuit YS01 is not in the ON state, and the precharge circuit PC01 keeps the ON state.

Accordingly, the bit line pair BP01 (BT01/BN01) keeps the potential at the VDD, or keeps the potential of around VDD-a within a range of minor (a) fluctuation, if any.

After the data is read out or written, at time T2, the selection signal Ysel00 of the Y-switch circuit YS00 and the word line WORD are made back to the L level before going back again to the standby state where neither the data writing nor data reading is performed. When the selection signal Ysel00 of the Y-switch circuit YS00 is made back to the L level, the Y-switch circuit YS00 is in the OFF state. As the Y-switch circuit YS00 is in the OFF state, the individual control unit 2200 outputs the precharge control signal PCsg00 that turns on the precharge circuit PC00 in accordance with the Y operation signal YSW00 from the Y-switch circuit YS00 and the precharge circuit PC00 is in the ON state.

As the Y selection signal Ysel01 keeps the L level, the Y-switch circuit YS01 remains in the OFF state and the precharge circuit PC01 remains in the ON state.

At this time, the load applied to the power supply VCC of the precharge circuit PC00 corresponds to the current that is needed to charge the bit line pair BP00 (BT/BN00) by one precharge circuit PC00, which is extremely small.

Accordingly, the power supply drop is not produced even when the precharge operation is made, whereby the stable high-speed operation is made possible by performing prompt precharge.

As described above, in the normal mode, in the precharge circuit control unit 200, each of the individual control units 2200 and 2201 controls each of the precharge circuits PC00 and PC01 in accordance with the operation of each of the Y-switch circuits YS00 and YS01, so as to turn off only the precharge circuit PC00 or PC01 of the bit line pair which is selected.

Only the precharge circuit PC00 or PC01 of the bit line pair which is selected is turned off, and thus, the current consumption becomes extremely small in the next precharge timing, which enables to perform the high-speed operation.

Next, the operation in the test mode will be described.

Figure 3:
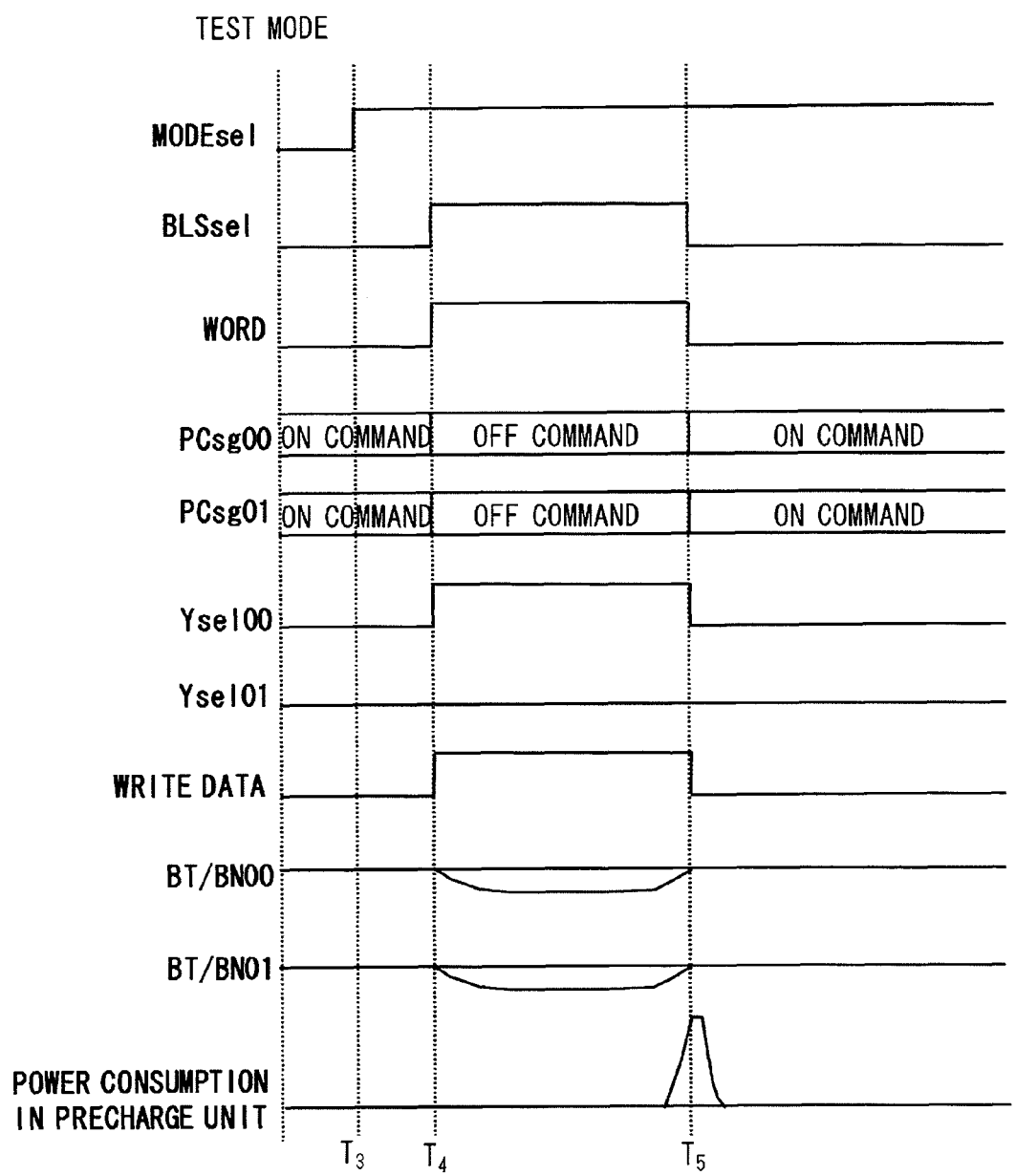
FIG. 3 is a timing chart in a test mode according to the first exemplary embodiment.

FIG. 3 is a timing chart in the test mode.

To switch the mode to the test mode, the MODE selection signal MODEsel is in the H level at time T3. Then, the mode is switched to the test mode, and the block control unit 230 is in the ON state. To perform the test writing at time T4, the block selection signal BLKsel is changed to the H level at time T4.

When the block selection signal BLKsel is in the H level while the block control unit 230 is in the ON state in the test mode, the individual control unit group 220 outputs the precharge control signals PCsg00 and PCsg01 that turn off the precharge operation to all the precharge circuits PC00 and PC01 regardless of the operation of the Y-switch circuits YS00 and YS01.

As such, the precharge operation of all the precharge circuits PC00 and PC01 is in the OFF state.

Further, as the block selection signal BLKsel is in the H level at T4, the word line WORD that is connected to the memory cell C00 which is the test target is changed to the H level, and the Y selection signal Ysel00 that selects the bit line pair that is connected to the memory cell C00 which is the test target is in the H level.

On the other hand, the Y selection signal Ysel01 that selects the bit line pair that is connected to the memory cell C01 which is not the test target keeps the L level.

As the Y selection signal Ysel00 is in the H level, the Y-switch circuit YS00 is in the ON state, and the bit line pair BP00 (BT/BN00) is connected to the common bit line LP.

The write data is applied to the bit line pair BP00 from the common bit line pair LP with the writing unit 150 in this state for a long time to measure whether there is no leak current in the memory cell C00 which is the test target.

As the precharge circuit of the bit line pair BP01 (BT/BN01) that is connected to the memory cell C01 which is not the test target is in the OFF state as well, there is no current that flows in the memory array 110 from the precharge circuit.

As such, even when small leak current is produced in the memory cell C00 which is the test target, it can be detected with high accuracy and high resolution without being interrupted by noises, and the memory array 110 can be tested in detail.

Upon completion of the test of one memory cell C00 (time T5), the operation moves to the test of the next memory cell.

More specifically, the block selection signal BLKsel is in the L level, and the word line and the Y selection signal Ysel00 are made back to the L level. Then, the command that turns on the precharge circuits PC00 and PC01 is output from the individual control unit group 220. All the precharge circuits PC00 and PC01 are made ON state, and all the bit line pairs are in the precharge state.

At this time, as all the precharge circuits are in the OFF state and the potentials of all the bit line pairs are opened in the test mode, large current is temporarily consumed in order to perform precharge again. Although such a large current consumption may cause power supply drop, there is raised no problem as the high-speed operation is not required in the test mode.

According to the first exemplary embodiment, the following effects may be realized.

According to the first exemplary embodiment, the normal mode where the operation can be made with high speed and the test mode where each memory cell can be analyzed in detail are separated from each other. In the normal mode, only the precharge circuit of the bit line pair to which the memory cell which is the reading/writing target is connected is turned on or off, and the precharge circuit of the bit line pair which is not the reading/writing target is always in the ON state. As there is no large current consumption peak in the precharge and no power supply drop, the first exemplary embodiment is suitable for the high-speed operation.

On the other hand, the block control unit 230 is provided that turns off the precharge circuits PC00 and PC01 in the test mode when searching in detail each memory cell in the writing test by the long write.

As all the precharge circuits PC00 and PC01 are turned off in the test mode, the leak current from each memory cell can be accurately detected without being interrupted by other noise current and the memory array can be analyzed in detail.

Second Exemplary Embodiment

Next, the second exemplary embodiment of the present invention will be described.

Although the basic configuration of the second exemplary embodiment is the same as that of the first exemplary embodiment, the second exemplary embodiment specifically forms the precharge circuit control unit by logic circuits.

Figure 4:
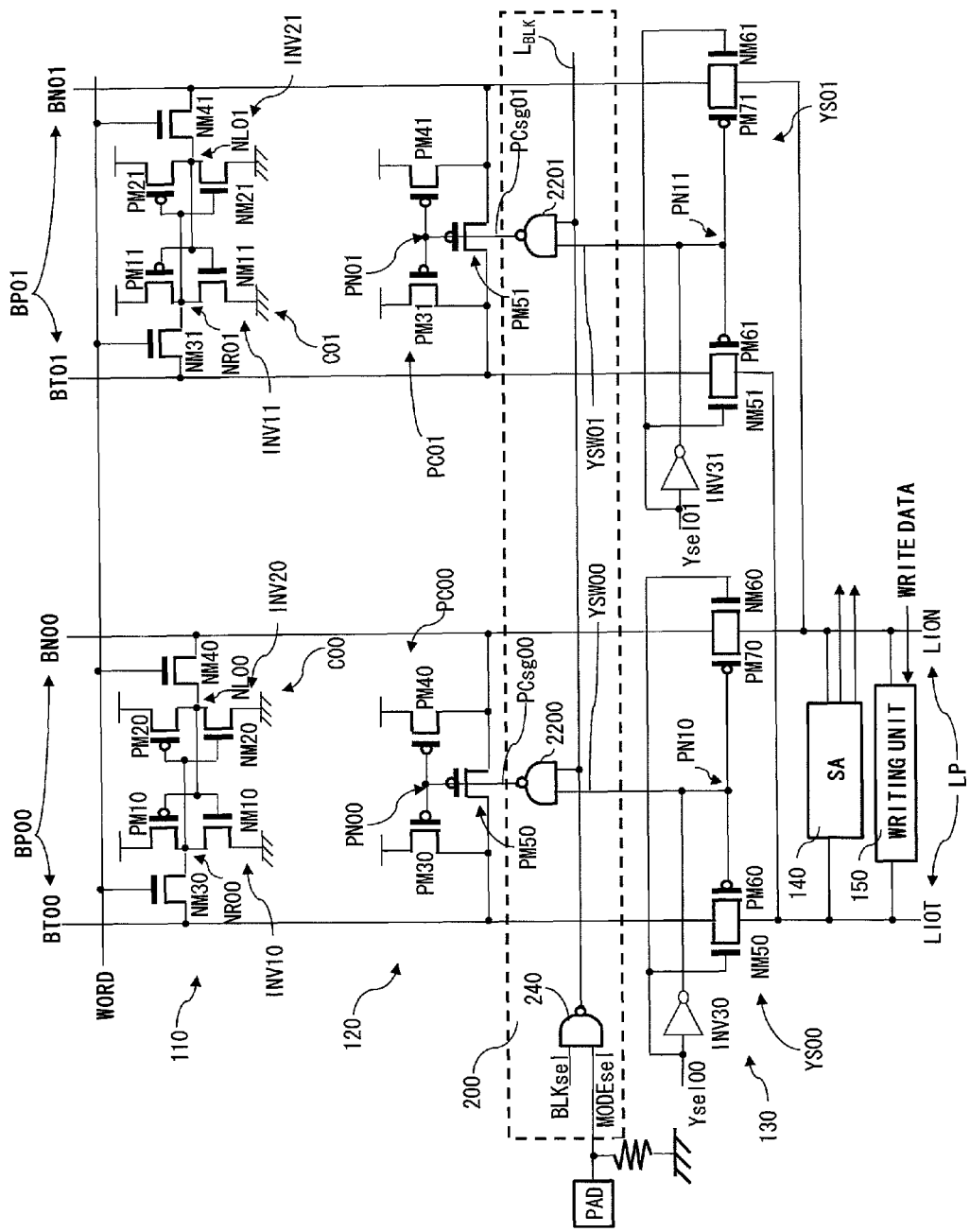
FIG. 4 is a diagram showing the configuration according to a second exemplary embodiment.

FIG. 4 shows the configuration of the second exemplary embodiment.

Note that the elements that are the same as those in the first exemplary embodiment (FIG. 1) are denoted by the same reference symbols.

First, the configuration of the memory cell C00 will be described with reference to FIG. 4.

The memory cell C00 includes an inverter INV10 including an nMOS transistor NM10 and a pMOS transistor PM10, and an inverter INV20 including an nMOS transistor NM20 and a pMOS transistor PM20.

The inverter INV10 and the inverter INV20 form a flip-flop in which each input and each output are cross-connected to each other. One storage node NR00 of this flip-flop is connected to the bit line BT00 by an nMOS transistor NM30. The other storage node NL00 of the flip-flop is connected to the bit line BN00 by an nMOS transistor NM40. Each gate of the nMOS transistor NM30 and the nMOS transistor NM40 is connected to the word line W.

The memory cell C01 has the same configuration as that of the memory cell C00. More specifically, the memory cell C01 includes an inverter INV11 including an nMOS transistor NM11 and a pMOS transistor PM11, and an inverter INV21 including an nMOS transistor NM21 and a pMOS transistor PM21. A storage node NR01 is connected to the bit line BT01 through an nMOS transistor NM31, and a storage node NL01 is connected to the bit line BN01 through an nMOS transistor NM41.

Each gate of the nMOS transistor NM31 and the nMOS transistor NM41 is connected to the word line W.

The precharge circuit PC00 includes pMOS transistors PM30 and PM40 that are provided between the power supply voltage VCC and the bit line pair BP00 (BT00, BN00), and a pMOS transistor PM50 provided between the bit line pair BP00.

Each gate of the three pMOS transistors PM30, PM40, and PM50 is connected to one common node (precharge control node) PN00.

The precharge circuit PC01 has the configuration that is the same to that of the precharge circuit PC00, and the precharge circuit PC01 includes pMOS transistors PM31 and PM41 that are provided between the power supply voltage VCC and the bit line pair BP01 (BT01, BN01), and a pMOS transistor PM51 that is provided between the bit line pair BP01.

Then, each gate of the three pMOS transistors PM31, PM41, and PM51 is connected to one common node (precharge control node) PN01.

Next, the configuration of the Y-switch circuit YS00 will be described.

The Y-switch circuit YS00 includes an nMOS transistor NM50 and a pMOS transistor PM60 that are provided in one bit line BT00, an nMOS transistor NM60 and a pMOS transistor PM70 that are provided in the other bit line BN00, and an inverter INV30 that inverts the Y selection signal Ysel00 to supply the inverted signal to each gate of the pMOS transistors PM60 and PM70.

The pMOS transistor PM60 and the pMOS transistor PM70 include gates that are connected at a common node PN10, and a Y selection signal inverted by the inverter INV30 is input to the node PN10.

Further, the Y selection signal Ysel00 is input to the gates of the nMOS transistor NM50 and the nMOS transistor NM60.

The Y-switch circuit YS01 has the configuration that is the same to that of the Y-switch circuit YS00, and includes an nMOS transistor NM51 and a pMOS transistor PM61 that are provided in one bit line BT01, an nMOS transistor NM61 and a pMOS transistor PM71 that are provided in the other bit line BN01, and an inverter INV31 that inverts the Y selection signal to supply the inverted signal to each gate of the pMOS transistors PM61 and PM71.

In FIG. 4, the precharge circuit control unit 200 includes a unifying NAND circuit 240 to which two signals of the MODE selection signal MODEsel and the block selection signal BLKsel are input. The unifying NAND circuit 240 performs mode switching control and comprehensively controls all the precharge circuits in the test mode. The precharge circuit control unit 200 further includes a plurality of individual NAND circuits 2200 and 2201 that are provided between the Y-switch circuits YS00, YS01 and the precharge circuits PC00, PC01, respectively.

The unifying NAND circuit 240 receives two inputs of the MODE selection signal MODEsel and the block selection signal BLKsel, and the output signal is output to the block control line LBLK.

The block control line LBLK is horizontally arranged between all the precharge circuits PC00, PC01 and the Y-switch circuits YS00, YS01, and one input of each of the individual NAND circuits 2200 and 2201 is connected to the block control line LBLK.

Each of the individual NAND circuits 2200 and 2201 receives two inputs of an output of the unifying NAND circuit 240 and the inverted Y selection signal.

The inverted Y selection signal means the Y selection signal through the inverters INV 30, 31 in the Y-switch circuits YS00, YS01, and is equal to the signal that is supplied to the nodes PN10 and PN11 to which gates of the pMOS transistors (PM60, PM70, PM61, PM71) are connected.

In summary, the inverted Y selection signal corresponds to the Y operation signals YSW00 and YSW01 in the first exemplary embodiment.

The outputs of the individual NAND circuits 2200 and 2201 are supplied to the nodes to which the gates of the pMOS transistors of the precharge circuits PC00 and PC01 are connected, and correspond to the precharge control signals PCsg00 and PCsg01 in the first exemplary embodiment.

As the individual NAND circuits 2200 and 2201 are connected to the precharge circuits PC00 and PC01 within a short distance, the size can be minimized in consideration of the area.

In such a configuration, the mode switching unit and the block control unit are formed by the unifying NAND circuit 240, and the individual control unit is formed by the individual NAND circuits.

Note that an input terminal of the mode selection signal MODEsel can be connected to a test pad which is externally connected. When a user uses the semiconductor memory device, nothing is connected to the test PAD but the test PAD is connected to the GND through a high resistor in order to fix the potential to the GND.

The operation of the second exemplary embodiment having such a configuration will be described.

Figure 5:
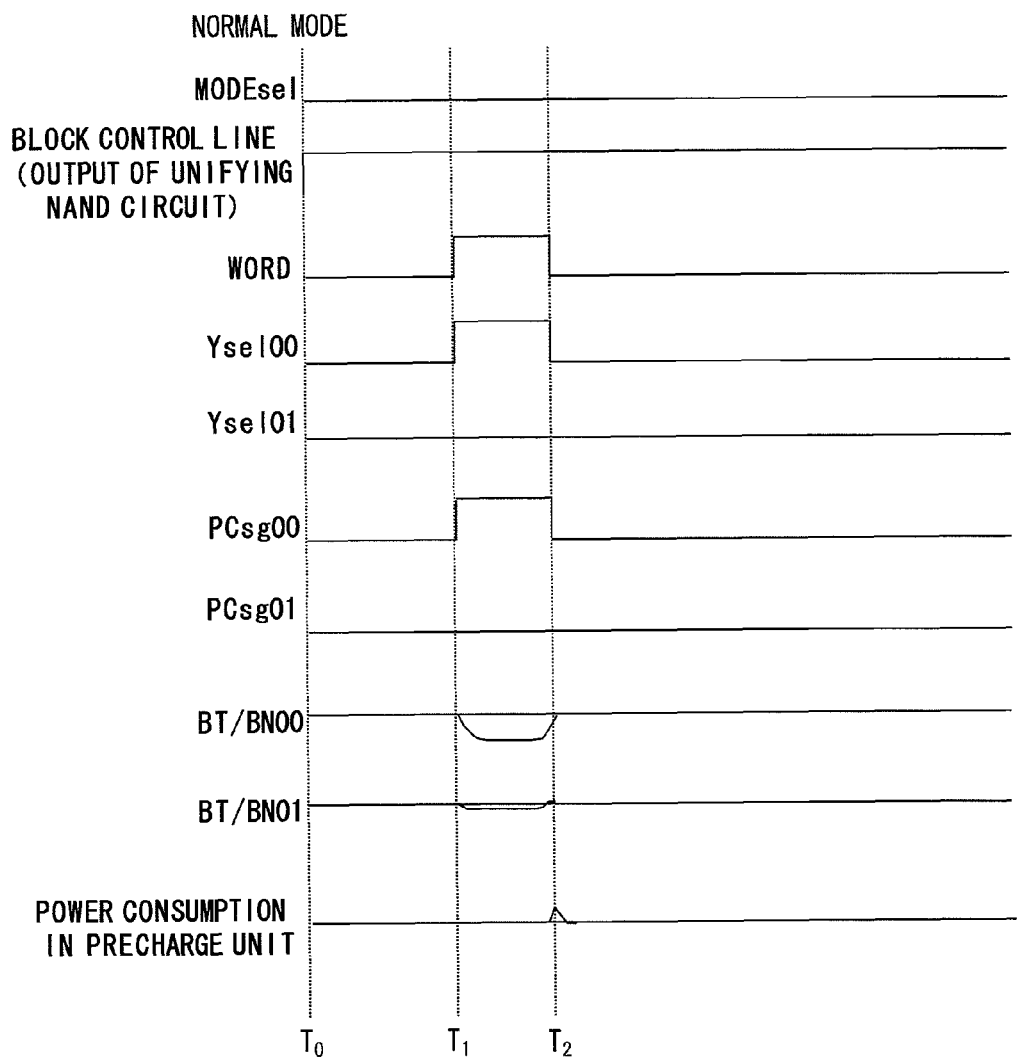
FIG. 5 is a timing chart describing the operation in the normal mode according to the second exemplary embodiment.

FIG. 5 is a timing chart describing the operation in the normal mode of the second exemplary embodiment.

FIG. 5 corresponds to FIG. 2 described in the first exemplary embodiment.

In FIG. 5, when the MODE selection signal is in the L level, the output of the unifying NAND circuit 240 is in the H level regardless of the block selection signal BLKsel.

When a period from time T0 to time T1 corresponds to the standby state where reading/writing is not performed, both of the Y selection signals Ysel00 and Ysel01 that select the Y-switch circuits YS00 and YS01 are in the L level.

At this time, one of the inputs of each of the individual NAND circuits 2200 and 2201 is in the H level from the unifying NAND circuit 240, and the other of the inputs is the Y operation signals YSW00 and YSW01 from the Y-switch circuits YS00 and YS01.

When the Y selection signals Ysel00 and Ysel01 are in the L level, the Y operation signals YSW00 and YSW01 that are obtained by inverting the Y selection signals Ysel00 and Ysel01 are in the H level.

Accordingly, the precharge control signals PCsg00 and PCsg01 that are outputs of the individual NAND circuits 2200 and 2201 are in the L level. When the L level is applied to the nodes PN00 and PN01 of the precharge circuits PC00 and PC01, the precharge circuits PC00 and PC01 are in the ON state.

At time T1, in performing the data reading/writing from/to the memory cell C00, the word line WORD to which the memory cell C00 is connected is made to the H level, and the Y selection signal Ysel00 of the Y-switch circuit YS00 that selects the bit line pair BP00 is made to the H level.

Then, in the individual NAND circuit 2200, one input from the block control line LBLK is in the H level, and the Y operation signal YSW00 which is the other input from the Y-switch circuit YS00 is in the L level.

Accordingly, the precharge control signal PCsg00 which is the output of the individual NAND circuit 2200 is in the H level, and the precharge circuit PC00 is in the OFF state.

Further, as the Y-switch circuit YS00 is in the ON state, the bit line pair BP00 (BT00/BN00) is connected to the common bit line pair LIOT/LION.

Then, in the bit line pair BP00 (BT/BN00), each of the bit lines BT00 and BN00 is gradually displaced to the VDD and the GND, respectively, in accordance with each potential of each of the storage nodes NR00 and NL00 of the memory cell C00. Thus, each potential of each of the bit lines BT00 and BN00 is directly transmitted to the common bit lines LIOT and LION and read out through the sense amplifier 140.

Note that the Y-switch circuit YS01 that selects the other memory cell C01 which is not the target of the reading/writing remains in the OFF state, and the Ysel01 that selects the other Y-switch circuit YS01 remains in the L level.

Then, the precharge control circuit PCsg01 which is the output from the other individual NAND circuit 2201 remains in the L level, and the precharge circuit PC01 keeps the ON state.

Accordingly, the bit line pair BP01 (BT01/BN01) holds the potential at VDD, or keeps VDD-a within a minor (a) fluctuation, if any.

After executing such a reading/writing operation, at time T2, the selection signal Ysel00 of the Y-switch circuit YS00 and the word line WORD are made back to the L level when going back to the standby state where the data writing/reading is not performed.

Then, the Y operation signal YSW00 from the Y-switch circuit YS00 is in the H level, the precharge control signal PCsg00 which is the output of the individual NAND circuit 2200 is in the L level, and the precharge circuit is in the ON state.

Note that, as the Y selection signal Ysel01 keeps the L level, the Y-switch circuit YS01 remains in the OFF state and the precharge circuit PC01 keeps the ON state.

At this time, the load applied to the power supply VCC of the precharge circuits PC00 and PC01 corresponds to the current that is needed to charge the bit line pair BP00 (BT/BN00) by one precharge circuit PC00, which is extremely small.

Accordingly, there is no caused power supply drop even when precharging, whereby the stable high-speed operation is made possible by performing the prompt precharge.

According to the configuration of the second exemplary embodiment, the semiconductor memory device which enables to perform the stable high-speed operation in the normal mode may be realized.

Next, the operation in the test mode will be described.

Figure 6:
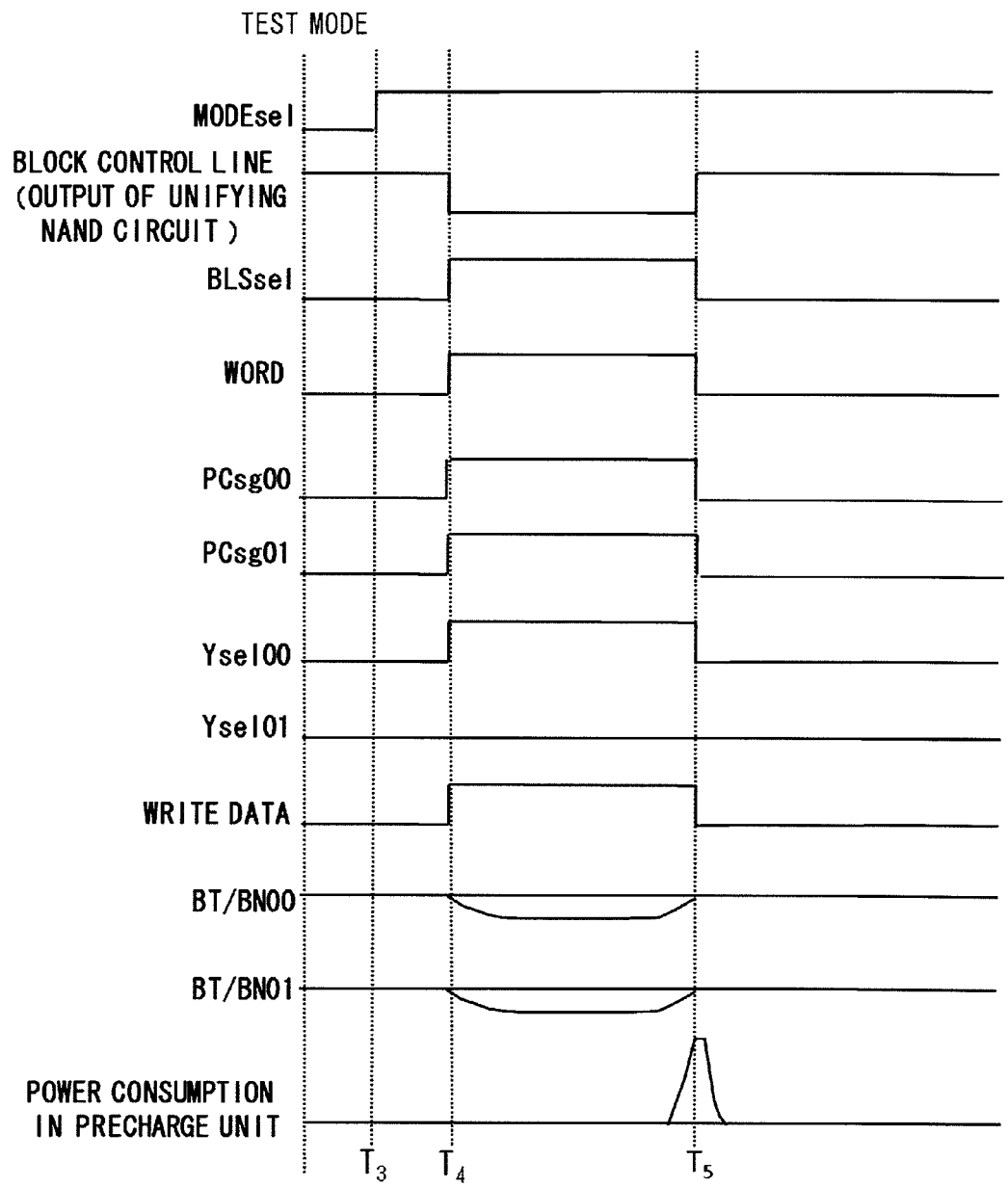
FIG. 6 is a timing chart in the test mode according to the second exemplary embodiment.
Figure 7:
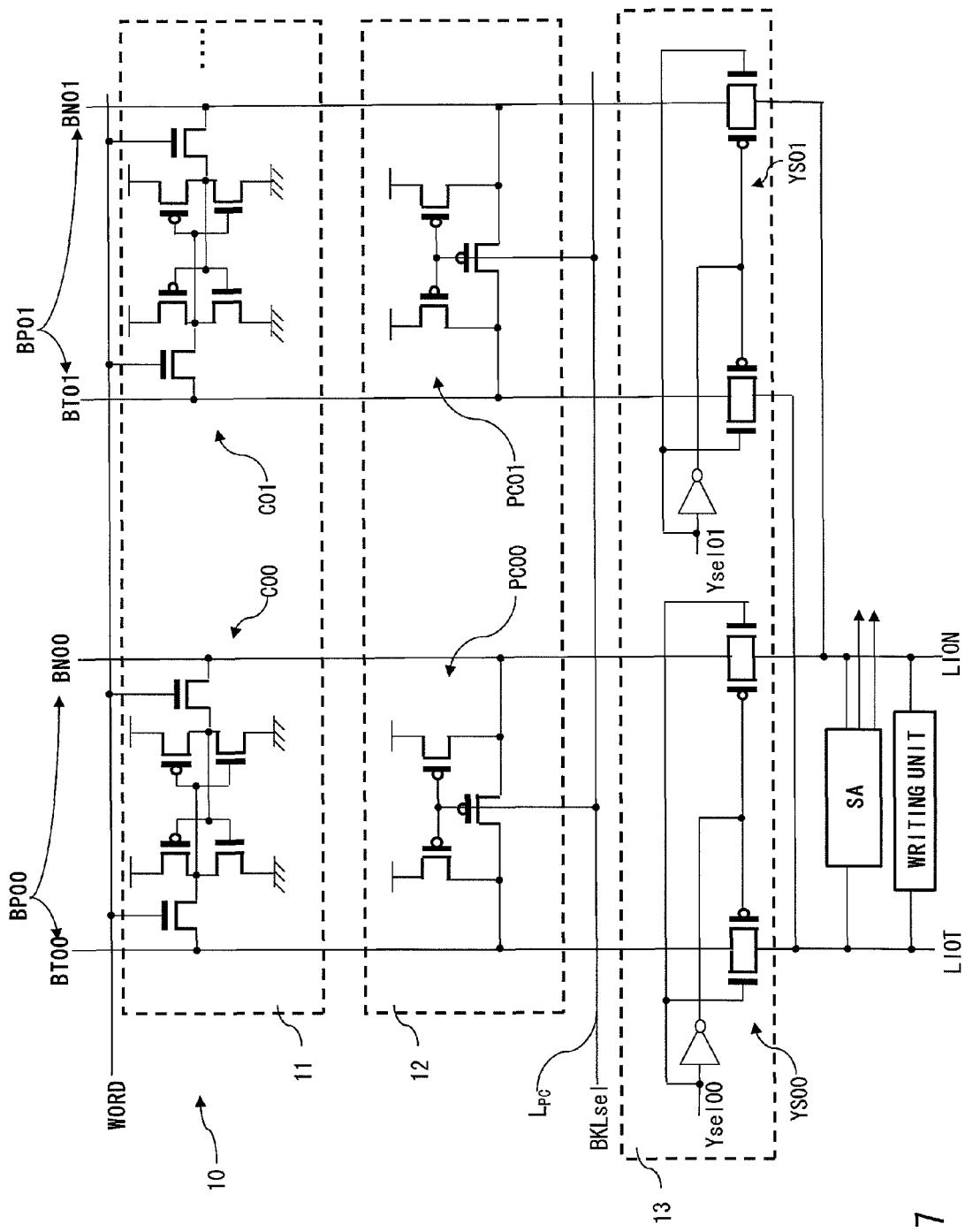
FIG. 7 is a diagram showing a circuit example of a semiconductor memory device where a precharge system employed in a low power SRAM is mounted.
Figure 8:
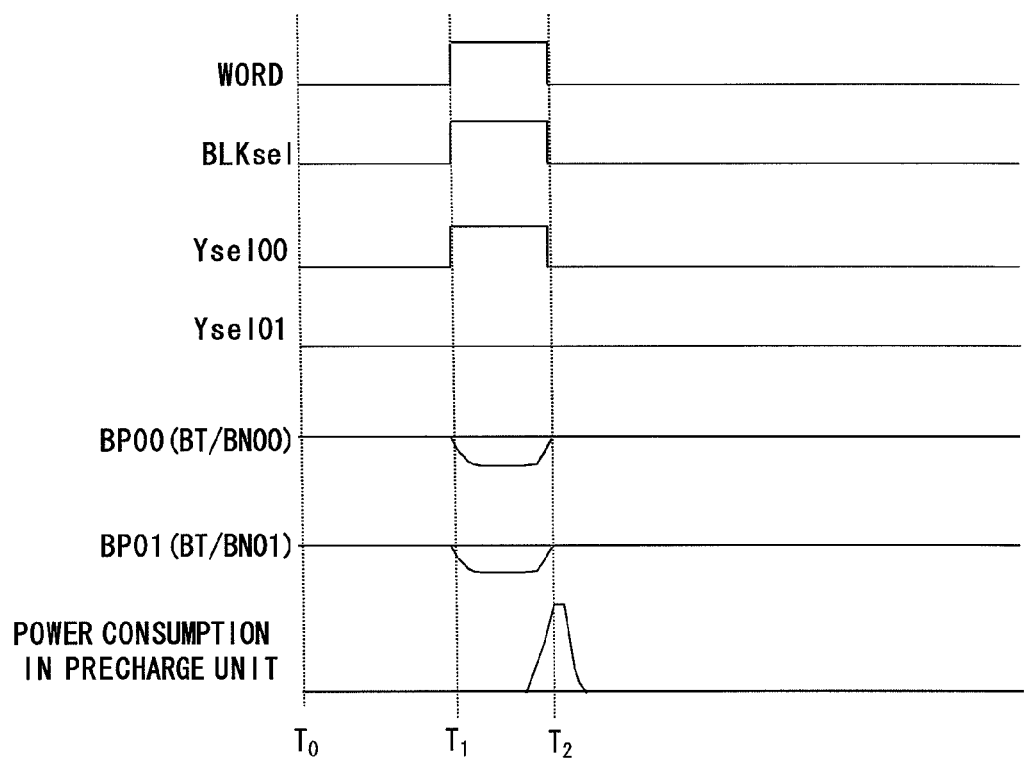
FIG. 8 is a timing chart describing the operation of the low power system SRAM.
Figure 9:
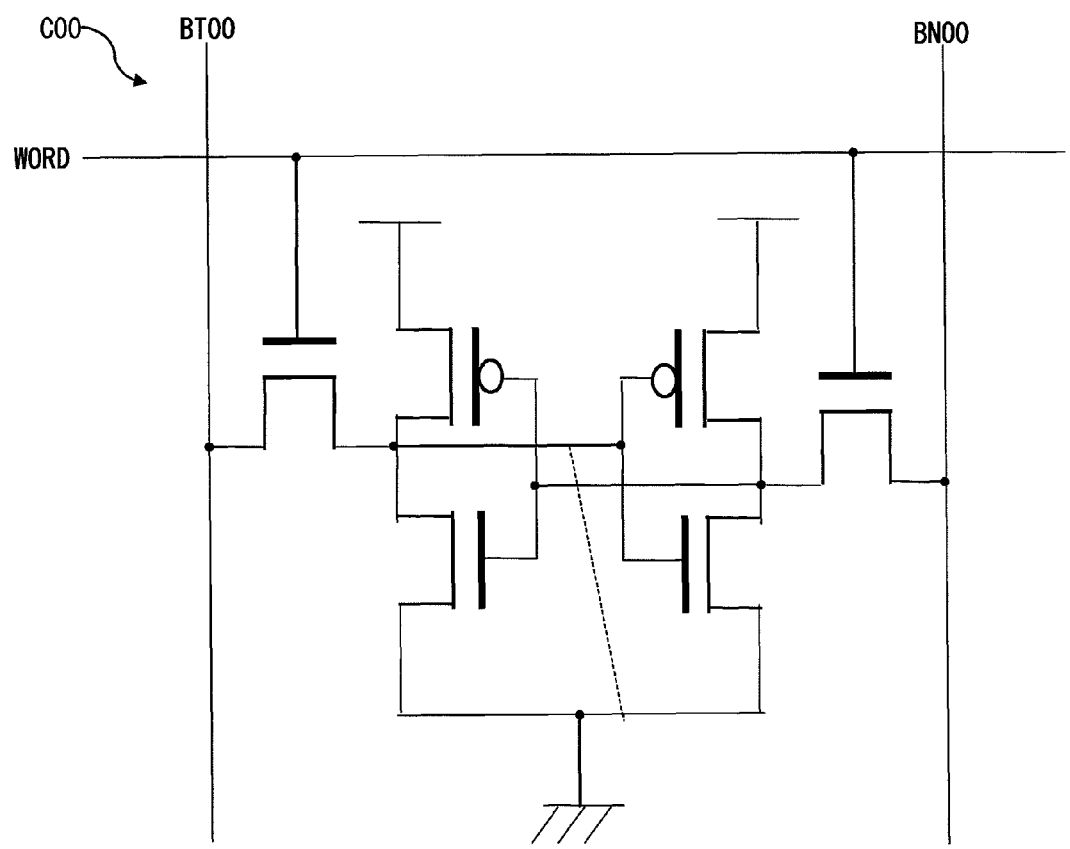
FIG. 9 shows an enlarged view of a static memory cell (SRAM)
Figure 10:
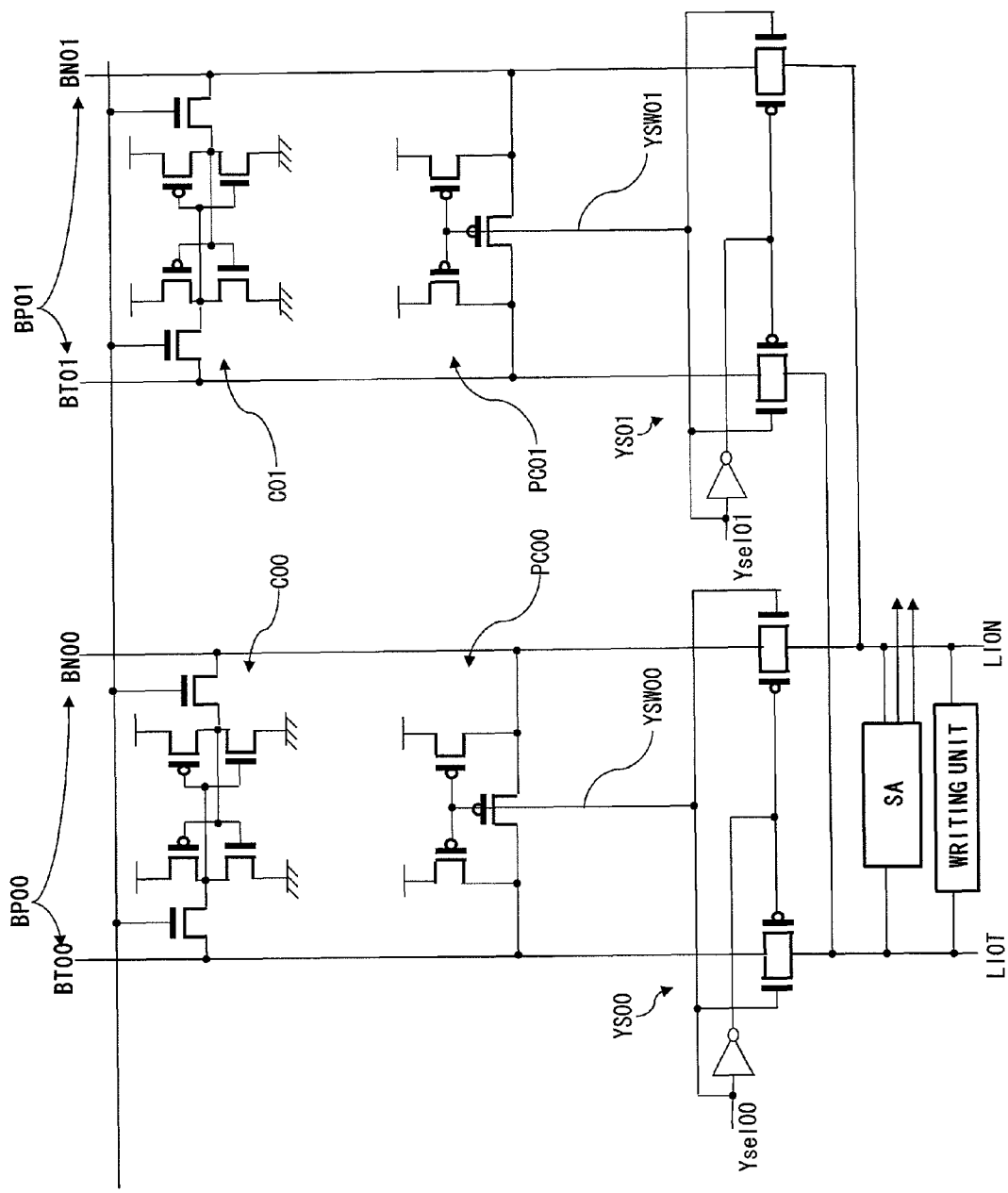
FIG. 10 is a diagram showing a circuit example where a precharge system employed in a normal high-speed system SRAM is mounted.
Figure 11:
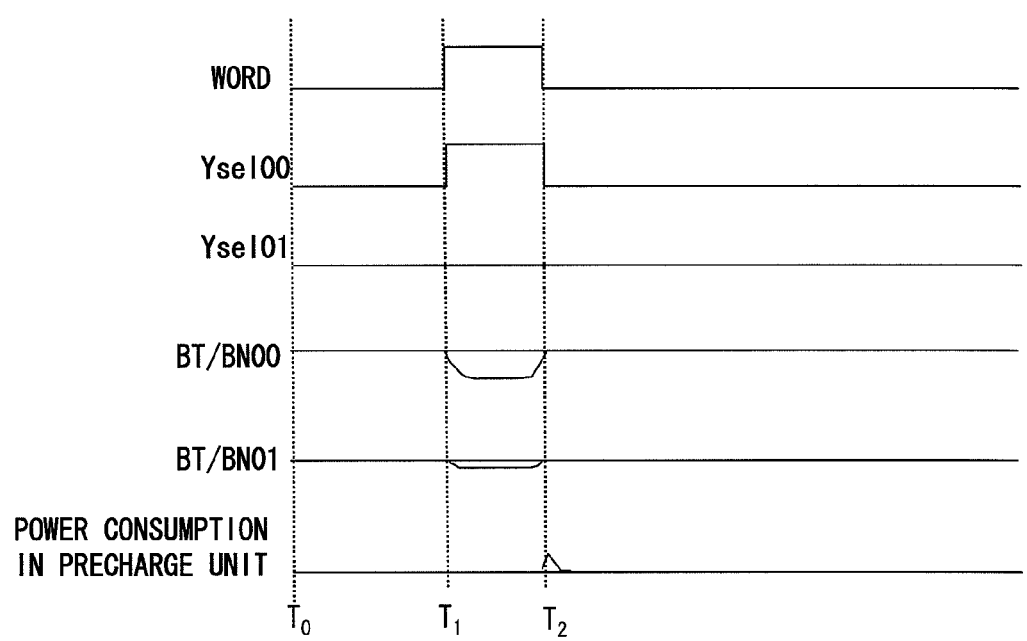
FIG. 11 is a timing chart describing the operation of the high-speed system SRAM.

FIG. 6 is a timing chart in the test mode.

FIG. 6 corresponds to FIG. 3 described in the first exemplary embodiment.

In FIG. 6, to switch the mode to the test mode, the MODE selection signal is in the H level at time T3.

Although the mode is switched to the test mode in this state, the block control line which is the output of the unifying NAND circuit 240 remains in the L level unless the block selection signal BLKsel is changed to the H level.

To perform the test writing at time T4, the block selection signal BLKsel is changed to the H level.

When both of the mode selection signal MODEsel and the block selection signal BLKsel are in the H level, the block control line LBKL which is the output of the unifying NAND circuit 240 is in the L level.

When the signal of the block control line LBKL is in the L level, one of the inputs of each of the individual NAND circuits 2200 and 2201 is in the L level. Then, the precharge control signals PCsg00 and PCsg01 that are outputs of the individual NAND circuits 2200 and 2201 are in the H level regardless of the Y operation signals YSW00 and YSW01 from the Y-switch circuits YS00 and YS01, and all the precharge circuits PC00 and PC01 are in the OFF state.

Then, as the block selection signal BLKsel is changed to the H level, the word line WORD that is connected to the memory cell C00 which is the test target is changed to the H level and the Y selection signal Ysel00 that selects the bit line pair BP00 that is connected to the memory cell C00 which is the test target is in the H level at time T4.

On the other hand, the Y selection signal Ysel01 that selects the bit line pair BP01 that is connected to the memory cell C01 which is not the test target keeps the L level.

As such, as the Y selection signal Ysel00 is in the H level, the Y-switch circuit YS00 is in the ON state and the bit line pair BP00 (BT/BN00) is connected to the common bit line LP.

After the write data is applied to the bit line pair BP00 from the common bit line pair LP by the writing unit 150 in this state, it is measured whether there is no leak current in the memory cell C00 which is the test target.

Upon completion of the test of one memory cell C00 (time T5), the operation moves to the test of the next memory cell.

At this time, the block selection signal BLKsel is in the L level, and the word line and the Y selection signal Ysel00 are made back to the L level. Then, as the inputs of the unifying NAND circuit 240 are the mode selection signal MODEsel which is in the H level and the block selection signal BLKsel which is in the L level, the block control line LBLK which is the output of the unifying NAND circuit 240 is in the H level. Then, the block control line LBLK which is one input of each of the individual NAND circuits 2200 and 2201 is in the H level.

Further, when the Y selection signal Ysel00 is in the L level, the Y-switch circuit YS00 is in the OFF state, and the Y operation signal YSW00, which is the Y selection signal that is inverted, is in the H level.

As such, the precharge control signals PCsg00 and PCsg01, which are the outputs of the individual NAND circuits 2200 and 2201, are in the L level, and the precharge circuits PC00 and PC01 are in the ON state.

Accordingly, all the precharge circuits PC00 and PC01 are in the ON state, and all the bit line pairs are in the precharge state.

At this time, as all the precharge circuits are turned off and the potentials of all the bit line pairs are opened in the test mode, large current is temporarily generated in order to perform precharge again.

Although such a large current consumption may cause power supply drop, no serious problem is raised as the high-speed operation is not required in the test mode.

As stated above, according to the configuration of the second exemplary embodiment, all the precharge circuits are in the OFF state in the test mode, and the detailed analysis for each memory cell can be realized.

According to the second exemplary embodiment as stated above, the same effect as in the first exemplary embodiment can be realized.

Furthermore, the complicated control in which the control of the precharge circuits is separated between the normal mode and the test mode can be realized with the simple configuration that only includes one unifying NAND circuit 240 and individual NAND circuits 2200 and 2201 whose number is the same as that of the precharge circuit. In summary, the second exemplary embodiment realizes the significant effect that the high-speed operation and the detailed analysis can be simultaneously realized even with the simple configuration.

Further, as the individual NAND circuits 2200, 2201 are connected to the precharge circuits PC00, PC01 in a short distance, the size may be minimized and the whole size can be sufficiently reduced.

Needless to say, the present invention is not limited to the above-described exemplary embodiments, but may be varied without departing from the spirit of the present invention.

Although the preferred circuit configuration is shown as the second exemplary embodiment to embody the present invention, the circuit configuration is not limited to the one shown in the second exemplary embodiment as long as the configuration realizes the functions such as the mode switching unit, the block control unit, the individual control unit and the like in realizing the present invention.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

The first and second exemplary embodiments can be combined as desirable by one of ordinary skill in the art.

What is claimed is:

1. A semiconductor memory device comprising:
a plurality of memory cells that are arranged at intersections of a word line with bit line pairs;
a precharge circuit that is arranged for each of the bit line pairs, the precharge circuit being configured to precharge each of the bit line pairs; and
a Y-switch circuit that is arranged for each of the bit line pairs, the Y-switch circuit being configured to select each of the bit line pairs, wherein
the semiconductor memory device is configured to execute two modes of a normal mode and a test mode by switching the two modes, the normal mode being a mode that executes reading or writing of normal memory data, the test mode being a mode that is capable of executing long write on a memory cell which is a test target, the semiconductor memory device further comprising:

a mode switching unit that switches the normal mode and the test mode in accordance with a mode selection signal that is externally supplied;

a plurality of individual control units that control operation of each of the precharge circuits in accordance with operation of each of the Y-switch circuits in the normal mode; and a block control unit that turns off all of the precharge circuits by a command by a block selection signal in the test mode.

2. The semiconductor memory device according to claim 1, wherein in the normal mode, upon selection of a bit line pair which is connected to a memory cell which is a reading target or a writing target of memory data by each of the Y-switch circuits, each of the individual control units turns off the precharge circuit connected to the bit line pair which is selected by the Y-switch circuit and keeps an ON state of a precharge circuit connected to a bit line pair which is not selected by the Y-switch circuit in accordance with the operation of the Y-switch circuit that performs the selection operation.

3. The semiconductor memory device according to claim 1, comprising:

a unifying NAND circuit that receives two inputs of the mode selection signal and the block selection signal and outputs an inverted logical AND of the two inputs to a block control line that is horizontally arranged between all the precharge circuits and the Y-switch circuits; and a plurality of individual NAND circuits, each of which including two inputs and one output, one of the two inputs being an output of the unifying NAND circuit and the other of the two inputs being an operation signal of each Y-switch circuit, the output being a control signal of each precharge circuit, wherein the mode switching unit and the block control unit are formed by the unifying NAND circuit; and the individual control units are formed of the individual NAND circuits.

4. The semiconductor memory device according to claim 3, wherein the operation signal of the Y-switch circuit which is the other input of the individual NAND circuit is a signal that is obtained by inverting a selection signal that operates the Y-switch circuit.

5. The semiconductor memory device according to claim 1, wherein the memory cell is a static memory cell.

* * * * *